US012808799B2

(12) United States Patent
Mutnury et al.

(10) Patent No.: US 12,808,799 B2
(45) Date of Patent: Nov. 24, 2026

(54) INFORMATION HANDLING SYSTEM WITH INTERNAL LEAK DETECTION

(71) Applicant: DELL PRODUCTS L.P., Round Rock, TX (US)

(72) Inventors: Bhyrav Mutnury, Round Rock, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 142 days.

(21) Appl. No.: 18/925,439

(22) Filed: Oct. 24, 2024

(65) Prior Publication Data

US 2026/0118269 A1 Apr. 30, 2026

(51) Int. Cl.
*G01N 21/64* (2006.01)
*H05K 7/20* (2006.01)

(52) U.S. Cl.
CPC ..... *G01N 21/6428* (2013.01); *H05K 7/20218* (2013.01); *G01N 2021/6439* (2013.01); *G01N 2201/0238* (2013.01)

(58) Field of Classification Search
CPC ....... G01N 21/6428; G01N 2021/6439; G01N 2201/0238; H05K 7/20218
See application file for complete search history.

(56) References Cited

U.S. PATENT DOCUMENTS 9,007,221 B2 * 4/2015 Zeighami ........... H05K 7/20781 165/80.4
10,064,314 B2 8/2018 Shelnutt et al.
10,143,114 B2 11/2018 Shelnutt et al.

FOREIGN PATENT DOCUMENTS

WO WO-2023156878 A1 * 8/2023 .............. G01M 3/16

* cited by examiner

*Primary Examiner* — Mark R Gaworecki
(74) *Attorney, Agent, or Firm* — Larson Newman, LLP

(57) ABSTRACT

An information handling system includes a system board comprising at least one electronic component. The information handling system also includes an internal cooling system in fluid communication with a cooling distribution unit. The cooling distribution unit selectively circulates liquid coolant through the internal cooling system. The information handling system also includes a fluid reactive leak detection zone adjacent one or more components of the internal cooling system. The fluid reactive leak detection zone comprises a coating that reacts to the presence of a fluid.

20 Claims, 5 Drawing Sheets

INFORMATION HANDLING SYSTEM WITH INTERNAL LEAK DETECTION

FIELD OF THE DISCLOSURE

The present disclosure generally relates to information handling systems, and more particularly relates to an information handling system having internal leak detection.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system is disclosed and includes a system board comprising at least one electronic component. The information handling system also includes an internal cooling system in fluid communication with a cooling distribution unit. The cooling distribution unit selectively circulates liquid coolant through the internal cooling system. The information handling system also includes a fluid reactive leak detection zone adjacent one or more components of the internal cooling system. The fluid reactive leak detection zone comprises a coating that reacts to the presence of a fluid.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
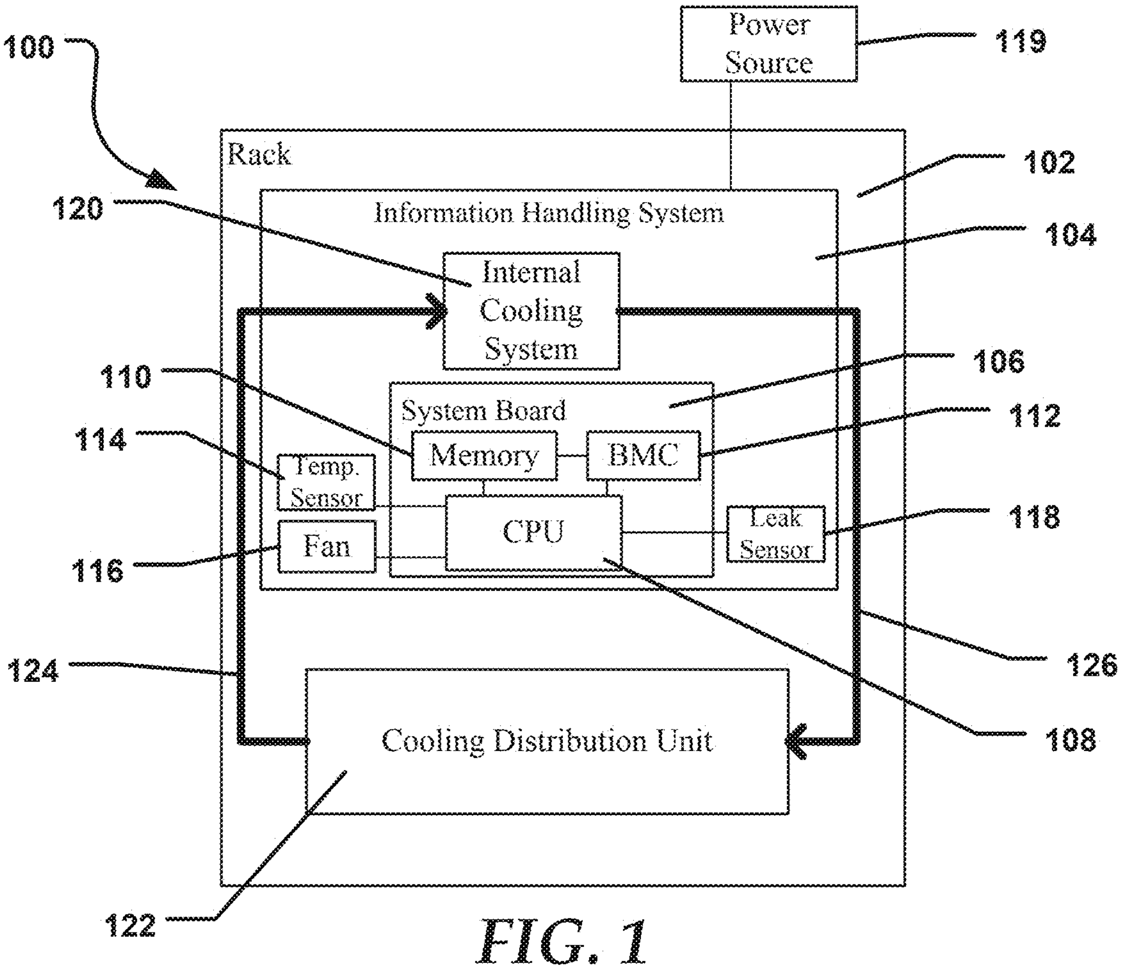
FIG. 1 is a block diagram of computing system according to an embodiment of the present disclosure.

FIG. 1 illustrates a system 100 that may include a rack 102, or cabinet, in which an inverted information handling system 104 is installed, or otherwise disposed. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

As shown, the information handling system 104 may include a system board 106, or motherboard, that may have several electronic components disposed thereon or coupled thereto. For example, the system board 106 may include a central processing unit (CPU) 108 installed, or otherwise disposed, thereon. The information handling system 104 may also include a memory 110 coupled to the CPU 108. Moreover, a baseboard management controller 112 may be disposed on the system board 106 and may be coupled to the CPU 108 and the memory 110. Other components necessary to the operation of the information handling system 104, and well known in the art, may be disposed on the system board 106. The information handling system 104 may also include a temperature sensor 114, a fan 116 adjacent the CPU 108, and an optical leak sensor 118. Additionally, the information handling system 104 may be coupled to a power source 119. The power source 119 may be an alternating current (AC) power source, a direct current (DC) power source, or a combination thereof. The power source 119 may provide power to all of the components described herein that required power to operate.

FIG. 1 further shows an internal cooling system 120 adjacent the system board 106. As shown, the internal cooling system 120 may be placed above the system board 106. However, it may be placed below the system board 106. In any event, the internal cooling system 120 is placed adjacent the CPU 108 which may generate and emit a substantial amount of heat during operation of the information handling system 102. A cooling distribution unit 122 may be connected to the internal cooling system 120 via a coolant supply line 124 and a coolant return line 126. It is to be understood that the cooling distribution unit 122 is in fluid communication with the internal cooling system 120 via the coolant supply line 124 and the coolant return line 126. During operation, the cooling distribution unit 122 may circulate coolant to the internal cooling system 120 via the coolant supply line 124 and the coolant return line 126 in order to lower the temperature of the internal cooling system 120 and therefore, transfer heat generated by the CPU 108 away from the CPU 108, and the system board 106, in order to lower the operating temperature of the CPU 108, the system board 106, and the other components disposed on the system board 106.

Figure 2:
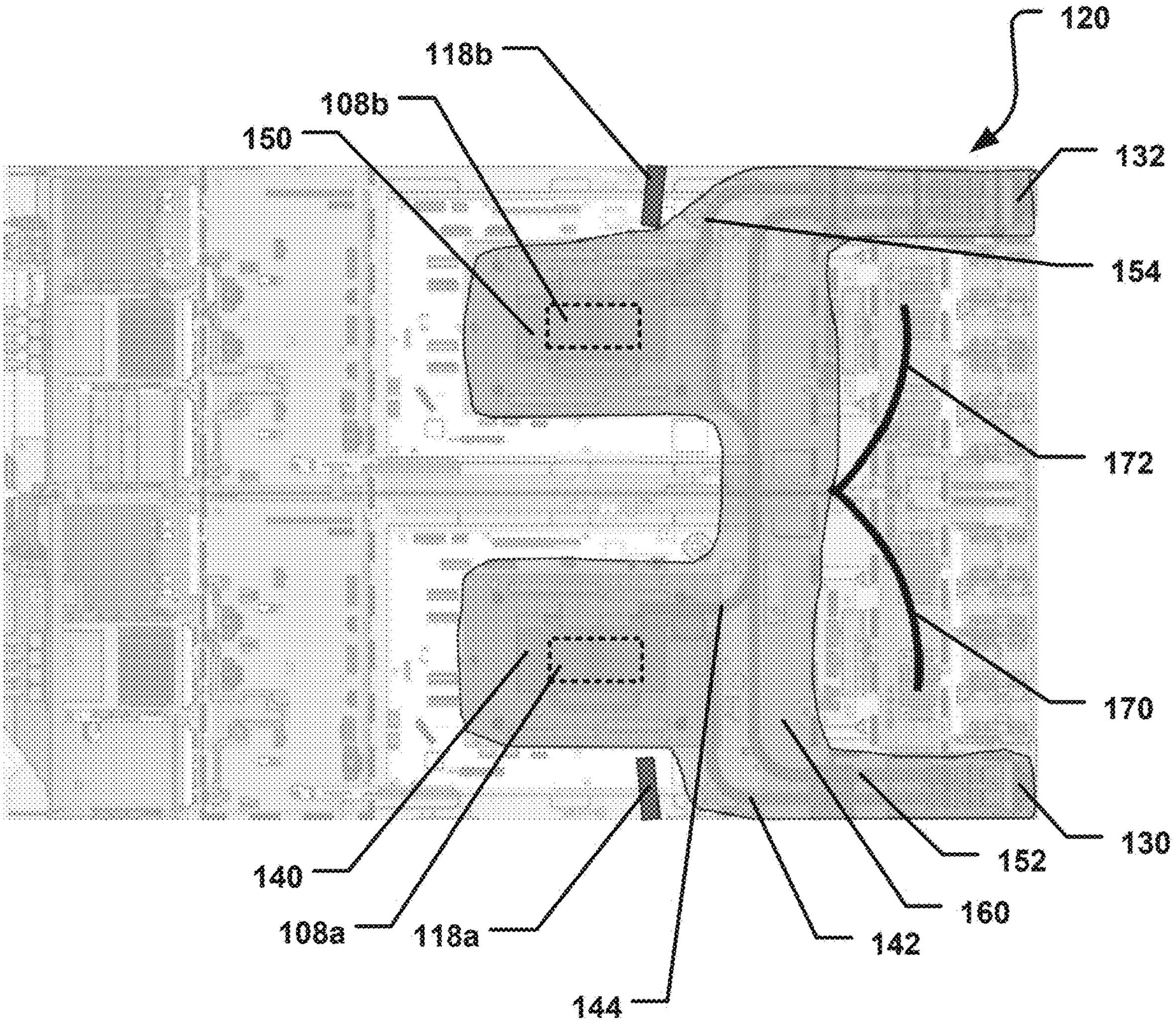
FIG. 2 is a top plan view of a system board and internal cooling system according to an embodiment of the present disclosure.
Figure 3:
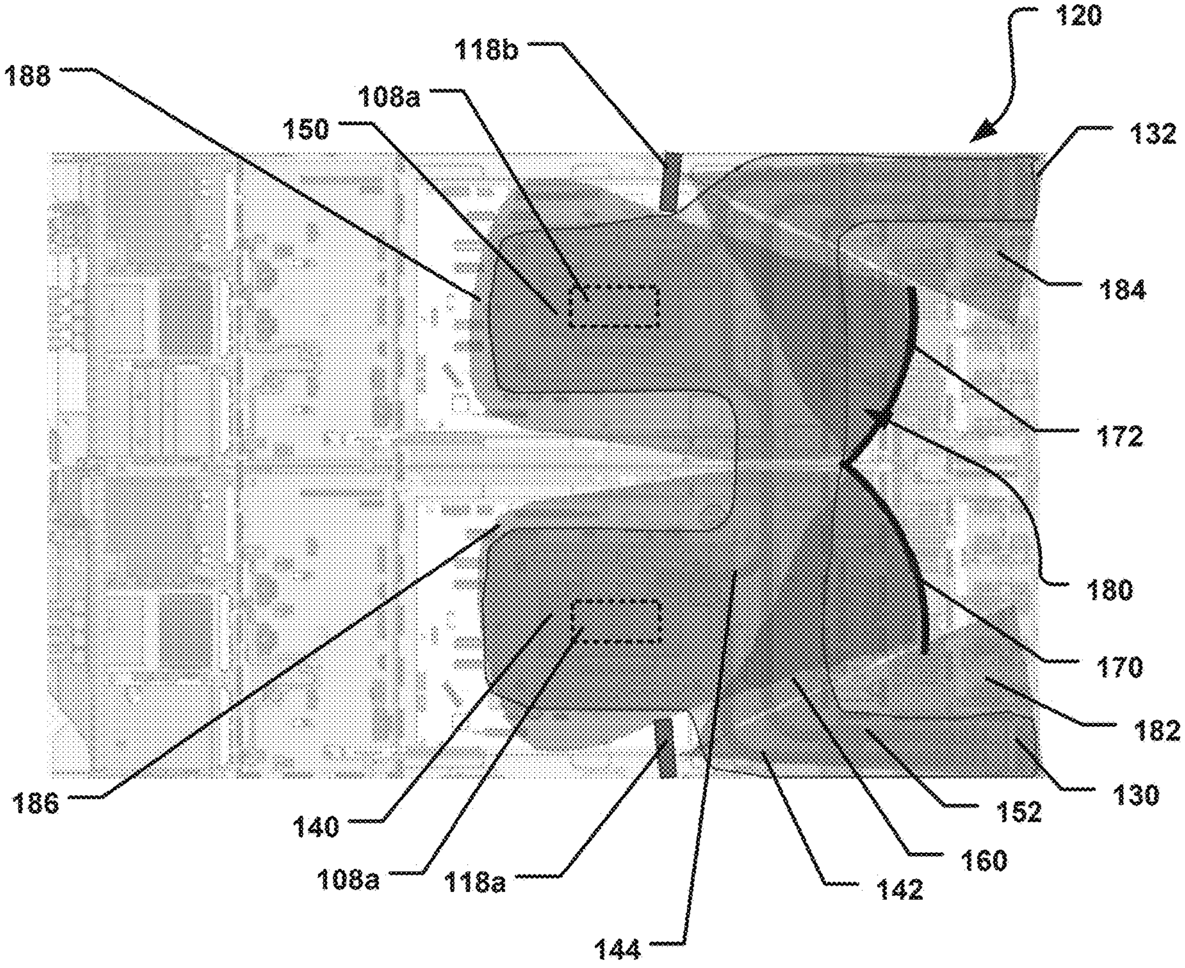
FIG. 3 is another top plan view of a system board and internal cooling system according to an embodiment of the present disclosure.

Referring to FIG. 2, further details of the system board 106 and the internal cooling system 120 are shown. In particular, the system board 106 includes a first CPU 108*a* and a second CPU 108*b*. The internal cooling system 120 extends between an inlet 130 and an outlet 132. For example, the inlet 130 and the 132 may be quick connect fitting. The internal cooling system 120 may also include a first cold plate 140 that is located above, or otherwise adjacent, the first CPU 108*a*. A first internal supply line 142 may be connected between the inlet 130 and the first cold plate 140. A first return line 144 may be connected between the first cold plate 140 and the outlet 132. During operation, liquid coolant may enter the internal cooling system 120 via the inlet 130, flow through the first supply line 142 to the first cold plate 140, through the first return line 144, and exit via the outlet 132.

As further shown in FIG. 2, the internal cooling system 120 may also include a second cold plate 150 that is located above, or otherwise adjacent, the second CPU 108*b*. A second internal supply line 152 may be connected between the inlet 130 and the second cold plate 150. A second return line 154 may be connected between the second cold plate 140 and the outlet 132. Accordingly, during operation, liquid coolant may enter the internal cooling system 120 via the inlet 130, flow through the second supply line 152 to the second cold plate 150, through the second return line 154, and exit via the outlet 132.

In a particular embodiment, all, or a portion of, the internal cooling system 120 may be coated with a fluid reactive fluorescent coating, e.g., a water reactive fluorescent coating. It is to be understood that the water reactive fluorescent coating may be a liquid coating that is applied with a brush or a sprayer and then, allowed to dry. In another aspect, the water reactive fluorescent coating may be a powder that is applied dry. Further, the water reactive fluorescent coating may include a fluorescent pigment or dye. Moreover, the water reactive fluorescent coating does not react to UV radiation when dry. However, when wet, due to the presence of a leak in the internal cooling system, the wet area will react to UV radiation and the fluorescent pigment or dye in the wet area will fluoresce in the presence of UV radiation. As such, any leaks may be quickly detected using a sensor.

For example, the coated components may include: the supply lines 142, 152; the return lines 144, 154; the cold plates 140, 150; any fittings, joints, valves, quick connects, etc., within the internal cooling system 120; and the areas of the system board 106 in the vicinity of the various parts of the internal cooling system 120. As such, a fluid reactive leak detection zone 160 may be created within the information handling system 104 around the internal cooling system 120 and the components thereof. In particular, the fluid reactive leak detection zone 160 is reactive to water and any location that is wetted due to a leak will fluoresce in the presence of UV light.

FIG. 2 further indicates that the information handling system 104 may include two optical leak sensors 118, i.e., a first optical leak sensor 118*a* and a second optical leak sensor 118*b*. The information handling system 104 may also include a first optical reflector 170 aligned with, and spaced apart from, the first optical leak sensor 118*a*, and a second optical reflector 172 aligned with, and spaced apart from, the second optical leak sensor 118*b*. The sensors 118*a*, 118*b* and the reflectors 170, 172 are placed in a manner to create a leak monitoring zone 180 that substantially overlaps with the leak detection zone 160. The leak monitoring zone 180 includes a first direct monitoring zone 182 in the view area of the first optical leak sensor 118*a*, a second direct monitoring zone 184 in the view area of the second optical leak sensor 118*b*, a first indirect monitoring zone 186 in the extended view area provided by the first reflector 170, and a second indirect monitoring zone 188 in the extended view area provided by the second reflector 172. Accordingly, the placement of the sensors 118*a*, 118*b* and the reflectors 170, 172 to create the leak monitoring zone 180 allows the sensors 118*a*, 118*b* to detect leaks anywhere in the leak detection zone 160.

In a particular embodiment, the leak detection zone 160 defines an area, $A_{ZD}$. The leak monitoring zone 180 defines an area, $A_{ZM}$. In another particular embodiment, $A_{ZM}$ completely overlaps $A_{ZD}$. Further, $A_{ZM}$ is greater than or equal to $A_{ZD}$. For example, in one aspect, $A_{ZM}$ is greater than or equal to 1.05 $A_{ZD}$, such as greater than or equal to 1.10 $A_{ZD}$, greater than or equal to 1.15 $A_{ZD}$, greater than or equal to 1.20 $A_{ZD}$, or greater than or equal to 1.25 $A_{ZD}$. In another aspect, $A_{ZM}$ is less than or equal to 1.50 $A_{ZD}$, such as less than or equal to 1.45 $A_{ZD}$, less than or equal to 1.40 $A_{ZD}$, less than or equal to 1.35 $A_{ZD}$, or less than or equal to 1.30 $A_{ZD}$. It is to be understood that $A_{ZM}$ may be withing a range between, and including, any of the minimum or maximum values of $A_{ZM}$ described herein.

Figure 4:
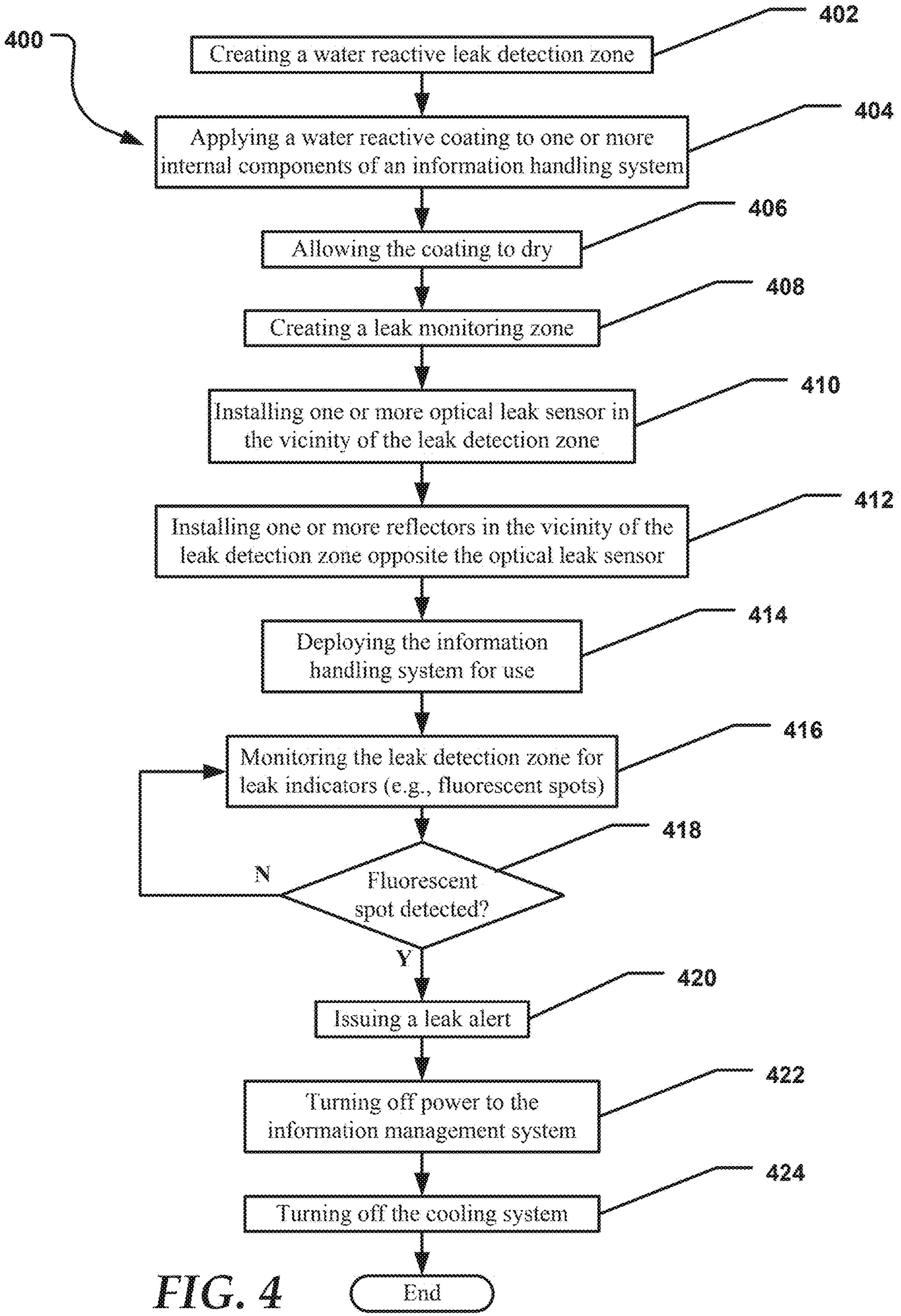
FIG. 4 is a flow diagram of a method for monitoring liquid coolant in an information handling system according to an embodiment of the present disclosure.

FIG. 4 is a flow diagram of a method 400 of leak detection in an information handling system, e.g., information handling system 104, according to at least one embodiment of the present disclosure, starting at block 402. It will be readily appreciated that not every method step set forth in this flow diagram is always necessary, and that certain steps of the methods may be combined, performed simultaneously, in a different order, or perhaps omitted, without varying from the scope of the disclosure. The method steps depicted in FIG. 4 may be executed, or employed in whole, or in part, by the baseboard management controller 112, the CPU 108 of the information handling system 104, a combination thereof, or any other type of controller, device, module, processor, or any combination thereof, operable to employ, or otherwise execute, all, or portions of, the method 400 of FIG. 4.

Beginning at block 402, the method 400 may include creating a water reactive leak detection zone. The water reactive leak detection zone may be created, for example, at blocks 404 and 406. At block 404, the method 400 may include applying a water reactive coating to one or more internal components of an information handling system 104. The water reactive coating may include a water reactive fluorescent coating that may be applied as a liquid. Further, the water reactive fluorescent coating may include a fluorescent pigment or dye. Moreover, the water reactive fluorescent coating does not react to UV radiation when dry. However, when wet, due to the presence of a leak in the internal cooling system, the wet area will react to UV radiation and the fluorescent pigment or dye in the wet area will fluoresce in the presence of UV radiation. The one or more coated internal components may include: the supply lines 142, 152; the return lines 144, 154; the cold plates 140, 150; any fittings, joints, valves, quick connects, etc., within the internal cooling system 120; and the areas of the system board 106 in the vicinity of the various parts of the internal cooling system 120. Moving to block 406, the method 400 may include allowing the coating to dry.

At block 408, the method 400 may include creating a leak monitoring zone. The leak monitoring zone may be created, for example, at blocks 410 and 412. At block 410, the method 400 may include installing one or more optical leak sensor in the vicinity of the leak detection zone. Moreover, at block 412, the method 400 may include installing one or more reflectors in the vicinity of the leak detection zone opposite the optical leak sensor. Thereafter, at block 414, the method 400 may deploying the information handling system for use, e.g., installing the information handling system in a rack or cabinet.

At block 416, the method 400 may include monitoring the leak detection zone for leak indicators. For example, the leak indicators may include fluorescent spots that appear under UV light when water wets the water reactive fluorescent coating. At decision step 418, the method 400 may include determining whether a fluorescent spot is detected. If not, the method 400 may return to block 416 and continue as described herein. Otherwise, at decision step 418, if one or more fluorescent spots are detected in the leak detection zone, the method 400 may proceed to block 420 and the method 400 may include issuing a leak alert. Thereafter, the method 400 may include turn off power to the information management system at block 422 and turning off the cooling system at block 424. Then, the method 400 may end.

Figure 5:
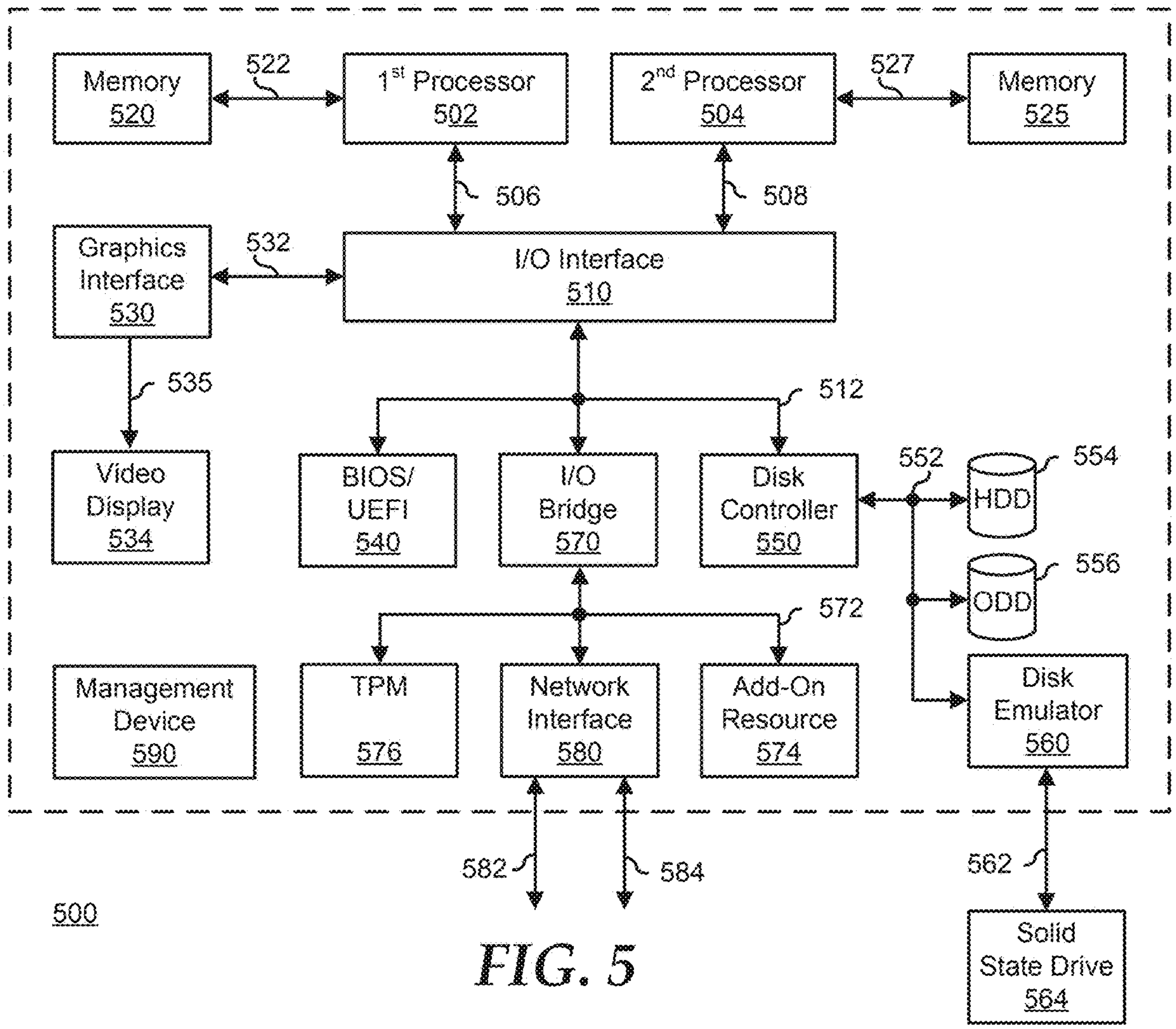
FIG. 5 is a block diagram of a general information handling system according to an embodiment of the present disclosure.

FIG. 5 shows a generalized embodiment of an information handling system 500 according to an embodiment of the present disclosure. Information handling system 500 may be substantially similar to the information handling system 104 of FIG. 1. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below and operates to perform one or more of the methods described herein. Information handling system 500 includes a processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 564, an I/O bridge 570, one or more add-on resources 574, a trusted platform module (TPM) 576, a network interface 580, a management device 590, and a power supply 595. Processors 502 and 504, I/O interface 510, memory 520, graphics interface 530, BIOS/UEFI module 540, disk controller 550, HDD 554, ODD 556, disk emulator 560, SSD 564, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532 and provides a video display output 536 to a video display 534. In a particular embodiment, information handling system 500 includes separate memories that are dedicated to each of processors 502 and 504 via separate memory interfaces. An example of memories 520 and 525 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 5394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512 or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500.

Management device 590 can operate off of a separate power plane from the components of the host environment so that the management device receives power to manage information handling system 500 when the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (IDRAC), an Embedded Controller (EC), or the like. Management device 590 may further include associated memory devices, logic devices, security devices, or the like, as needed, or desired.

The systems and methods described herein may provide leak detection direct liquid cooled (DLC) systems that are non-invasive to various liquid cooled information handling systems and that are coolant agnostic because the typical coolants are mostly water. The UV dye, or UV pigment, only fluoresces when wet in the presence of UV radiation. The coating containing the UV dye or pigment may be applied to various component or system surfaces. As such, an optical leak detect system is provided that uses the fluorescence of the UV illuminated dye or pigment. One or more reflectors may be included to steer light. And, the reflectors may be shaped to tailor coverage for required area that is not within direct line of sight of the one or more optical leak sensors. The reflectors may be parts of shrouds or other existing plastic parts, covered by aluminum coated tape. Moreover, the reflectors may include holes, or apertures, to allow and promote cooling air flow.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:

a system board comprising at least one electronic component;

an internal cooling system in fluid communication with a cooling distribution unit, wherein the cooling distribution unit selectively circulates liquid coolant through the internal cooling system; and a fluid reactive leak detection zone adjacent one or more components of the internal cooling system, wherein the fluid reactive leak detection zone comprises a coating that reacts to the presence of a fluid.

2. The information handling system of claim 1, wherein the fluid reactive leak detection zone fluoresces when wetted with water.

3. The information handling system of claim 1, wherein the coating is a water reactive fluorescent coating that does not fluoresce when dry.

4. The information handling system of claim 3, wherein the water reactive fluorescent coating fluoresces when wetted with water.

5. The information handling system of claim 4, wherein the coating is applied to at least a portion of the internal cooling system.

6. The information handling system of claim 5, wherein the coating is applied to at least a portion of the system board.

7. The information handling system of claim 1, further comprising:

an optical leak sensor placed in the vicinity of the fluid reactive leak detection zone to create a leak monitoring zone; and a processor coupled to the optical leak sensor, the processor to monitor the leak detection zone for leak indicators.

8. The information handling system of claim 7, wherein the leak indicator includes a fluorescent spot that appears when wetted with water.

9. The information handling system of claim 8, the processor further to:

issue a leak alert when the fluorescent spot is detected.

10. The information handling system of claim 9, the processor further to:

turn off power to the information handling system when a fluorescent spot is detected.

11. A method comprising:

creating a water reactive leak detection zone within an information handling system;

creating a leak monitoring zone that overlaps the water reactive leak detection zone; and monitoring the leak detection zone for one or leak indicators.

12. The method of claim 11, wherein the water reactive leak detection zone is created by:

applying a water reactive coating to one or more components within the information handling system; and allowing the water reactive coating to dry.

13. The method of claim 12, wherein the leak monitoring zone is created by:

installing one or more optical leak sensor in the vicinity of the water reactive leak detection zone.

14. The method of claim 13, further comprising:

installing one or more reflectors in the vicinity of the leak detection zone opposite the one or more optical leak sensors.

15. An information handling system, comprising:

a system board comprising at least one central processing unit;

an internal cooling system in fluid communication with a cooling distribution unit, wherein the cooling distribution unit selectively circulates liquid coolant through the internal cooling system, the internal cooling system including a cooling plate adjacent the central processing unit;

a water reactive leak detection zone, wherein the water reactive leak detection zone comprises a coating applied to at least the cooling plate, wherein coating fluoresces when wetted with water; and a leak monitoring zone overlapping the water reactive leak detection zone.

16. The system of claim 15, wherein the leak monitoring zone is at least partially provided by an optical leak sensor disposed in the vicinity of the water reactive leak detection zone.

17. The system of claim 16, wherein the leak monitoring zone is at least partially provided by a reflector spaced from the optical leak sensor.

18. The system of claim 17, further comprising a processor to:

detect fluorescent spots indicating the presence of water; and issue a leak alert when one or more fluorescent spots are detected.

19. The system of claim 18, wherein the water reactive leak detection zone defines a first area, $A_{ZD}$, and the leak monitoring zone defines a second area, $A_{ZM}$, and the $A_{ZM}$ completely overlaps the $A_{ZD}$.

20. The system of claim 19, wherein the $A_{ZM}$ is greater than or equal to the $A_{ZD}$.

* * * * *